US 6,749,972 B2

(12) United States Patent
Yu (10) Patent No.: US 6,749,972 B2
(45) Date of Patent: Jun. 15, 2004

(54) OPTICAL PROXIMITY CORRECTION COMMON PROCESS WINDOW MAXIMIZATION OVER VARYING FEATURE PITCH

(75) Inventor: Shinn-Sheng Yu, Taichung (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 115 days.

(21) Appl. No.: 10/050,267

(22) Filed: Jan. 15, 2002

(65) Prior Publication Data

US 2003/0134205 A1 Jul. 17, 2003

(51) Int. Cl.$^7$ ............................ G03C 9/00; G06F 17/50; G06F 19/00

(52) U.S. Cl. .............................................. 430/5; 716/19

(58) Field of Search ...................... 430/5, 322; 716/19, 716/21, 20

(56) References Cited

U.S. PATENT DOCUMENTS 6,544,699 B1 * 4/2003 Kim et al. .................. 430/30

* cited by examiner

Primary Examiner—S. Rosasco
(74) Attorney, Agent, or Firm—Tung & Associates (57) ABSTRACT

Maximizing a common process window for optical proximity correction (OPC)-modified features of a semiconductor design having varying pitch is disclosed. For each pitch within a semiconductor design, a bias needed at the pitch that maximizes a common process window for the number of pitches given a critical dimension (CD) specification for a semiconductor design of the photomask is determined. The original layout for the semiconductor design of the photomask is then modified by performing rule-based optical-proximity correction (OPC), including adding the bias determined at each pitch, to yield a modified layout for the semiconductor design of the photomask. The modified layout is further modified by performing model-based on the modified layout such that exposed semiconductor wafer CD's at each pitch are at least substantially equal to the CD specification for the pitch, to yield a final layout for the semiconductor design of the photomask.

20 Claims, 7 Drawing Sheets

OPTICAL PROXIMITY CORRECTION COMMON PROCESS WINDOW MAXIMIZATION OVER VARYING FEATURE PITCH

FIELD OF THE INVENTION

This invention relates generally to semiconductor device fabrication, and more particularly to the use of optical proximity correction (OPC) masks in such fabrication.

BACKGROUND OF THE INVENTION

Since the invention of the integrated circuit (IC), semiconductor chip features have become exponentially smaller and the number of transistors per device exponentially larger. Advanced IC's with hundreds of millions of transistors at feature sizes of 0.25 micron, 0.18 micron, and less are becoming routine. Improvement in overlay tolerances in photolithography, and the introduction of new light sources with progressively shorter wavelengths, have allowed optical steppers to significantly reduce the resolution limit for semiconductor fabrication far beyond one micron. To continue to make chip features smaller, and increase the transistor density of semiconductor devices, IC's have begun to be manufactured that have features smaller than the lithographic wavelength.

Sub-wavelength lithography, however, places large burdens on lithographic processes. Resolution of anything smaller than a wavelength is generally quite difficult. Pattern fidelity can deteriorate dramatically in sub-wavelength lithography. The resulting semiconductor features may deviate significantly in size and shape from the ideal pattern drawn by the circuit designer. These distortions include line-width variations dependent on pattern density, which affect a device's speed of operation, and line-end shortening, which can break connections to contacts. To avoid these and other optical proximity effects, the semiconductor industry has attempted to compensate for them in the photomasks themselves.

This compensation is generally referred to as optical proximity correction (OPC). The goal of OPC is to produce smaller features in an IC using a given equipment set by enhancing the printability of a wafer pattern. OPC applies systematic changes to mask geometries to compensate for the nonlinear distortions caused by optical diffraction and resist process effects. A mask incorporating OPC is thus a system that negates undesirable distortion effects during pattern transfer. OPC works by making small changes to the IC layout that anticipate the distortions. OPC offers basic corrections and a useful amount of device yield improvement, and enables significant savings by extending the lifetime of existing lithography equipment. Distortions that can be corrected by OPC include line-end shortening and corner rounding, among others.

Line-end shortening (LES) is the shortening of the end of a metal line end in the actual fabricated semiconductor device as compared to the circuit designer's originally contemplated ideal device. OPC can be used to correct LES by adding serifs or hammerheads to the originally designed end in the photomask, such that during photolithography, the actually fabricated end more closely approximates the location of the originally designed end. Corner rounding is the degree to which the lithography process rounds feature corners that should be at sharp angles. OPC can be used to correct corner rounding by adding serifs to outside corners, which are called positive serifs, and subtracting serifs from the inside corners, which are called negative serifs, to the feature in the photomask.

Figure 1:
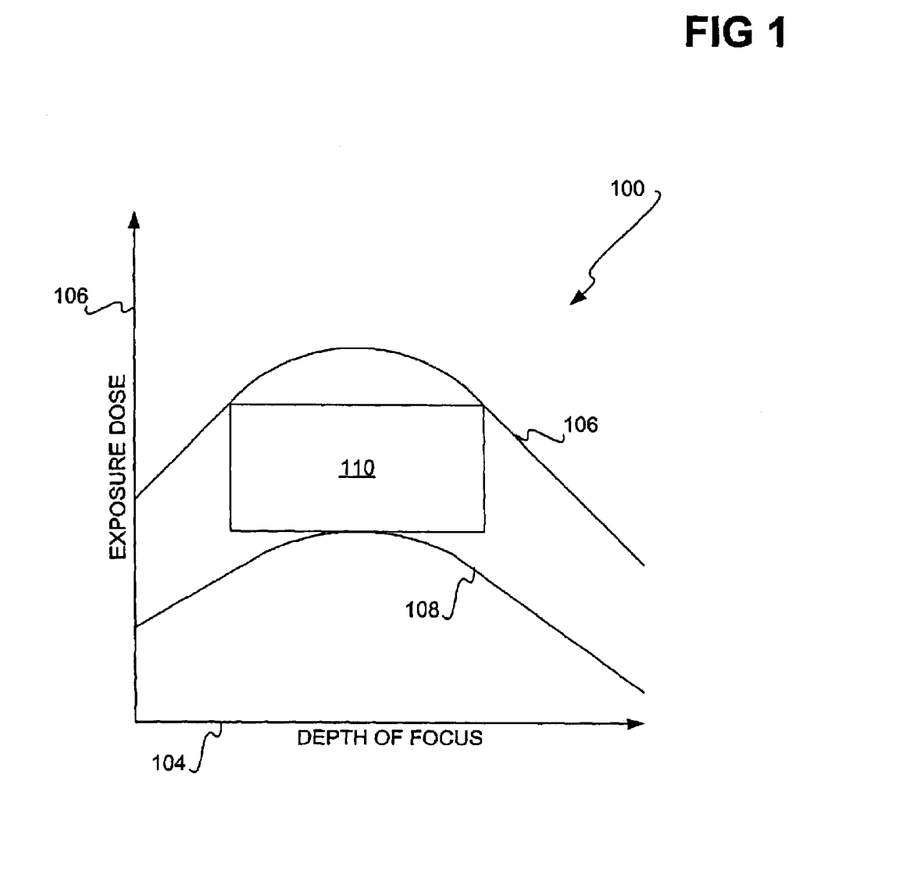
FIG. 1 is a diagram showing an example exposure-defocus (ED) process window for a given pattern feature showing the ranges of exposure dose and focus that permit acceptable lithographic quality.

A process window is the region enclosed on an exposure-defocus plane by two curves, corresponding to the upper and lower CD specifications, respectively. For example, FIG. 1 shows a graph 100 of a typical ED process window for a given semiconductor pattern feature. The y-axis 102 indicates exposure dose of the light source being used, whereas the x-axis 104 indicates depth of focus (DOF), which is the defocus range inside which lithographic performance is acceptable. The line 106 maps exposure dose versus DOF at one end of the tolerance range for the CD of the pattern feature, whereas the line 108 maps exposure dose versus DOF at the other end of the tolerance range for the CD of the feature.

The area 110 enclosed by the lines 106 and 108 is the ED process window for the pattern feature, indicating the ranges of both DOF and exposure dose that permit acceptable lithographic quality of the feature. Any DOF-exposure dose pair that maps within the area 110 permits acceptable lithographic quality of the pattern feature. Since the shape of the process window on the exposure-defocus plane is generally asymmetric, the CD at the process window center is not equal to the CD target. This is especially the case for isolated patterns, such as isolated trenches, even if scattering bars or anti-scattering bars are added.

Unfortunately, the process window typically varies by pattern feature. For example, the shape of the ED window for dense patterns, such as dense groupings of lines, is different than that for isolated patterns, such as isolated single lines. This is usually true even if the patterns have been modified by OPC to compensate for distortions. Individually optimizing the CD's of a wafer's features via OPC thus does not result in a maximized common process window over all the features. For various patterns, each having a different pitch-which is generally defined as the periodicity of a common pattern, such as a line-this means that applying OPC to each pattern to achieve identical pattern CD's results in unequal process windows. The unequal process windows cannot be matched to one another to create a maximized common window.

Therefore, there is a need for maximizing the common process window for OPC-modified features of a semiconductor pattern over varying pitch. Such a maximization process should provide as wide a range as possible of exposure dose and DOF that will result in an acceptable lithographic image. The process should still, however, optimize the CD's of the features as much as possible. For these and other reasons, there is a need for the present invention.

SUMMARY OF THE INVENTION

The invention relates to maximizing the common process window for optical proximity correction (OPC)-modified semiconductor features of varying pitch. For each pitch within a semiconductor design, a bias needed at the pitch that maximizes a common process window for the number of pitches given a critical dimension (CD) specification for a semiconductor design of the photomask is determined. The original layout for the semiconductor design of the photomask is then modified by performing rule-based optical-proximity correction (OPC), including adding the bias determined at each pitch, to yield a modified layout for the semiconductor design of the photomask. The modified layout is further modified by performing model-based on the modified layout such that exposed semiconductor wafer CD's at each pitch are at least substantially equal to the CD specification for the pitch, to yield a final layout for the semiconductor design of the photomask.

The invention provides for advantages not found within the prior art. Significantly, the depth of focus (DOF) of the maximized common process window obtained by using the invention can be increased by 0.1 to 0.2 microns, as compared to the common process window achieved in accordance with the prior art. This increase in DOF means that more leeway is provided for varying DOF at various exposure doses and still yielding an acceptable lithographic image on the semiconductor wafer. This increase in DOF still achieves optimizes CD's in accordance with the specification for the semiconductor design. Other advantages, embodiments, and aspects of the invention will become apparent by reading the detailed description that follows, and by referencing the attached drawings.

DETAILED DESCRIPTION OF THE INVENTION

In the following detailed description of exemplary embodiments of the invention, reference is made to the accompanying drawings that form a part hereof, and in which is shown by way of illustration specific exemplary embodiments in which the invention may be practiced. These embodiments are described in sufficient detail to enable those skilled in the art to practice the invention. Other embodiments may be utilized, and logical, mechanical, and other changes may be made without departing from the spirit or scope of the present invention. The following detailed description is, therefore, not to be taken in a limiting sense, and the scope of the present invention is defined only by the appended claims.

Figure 2:
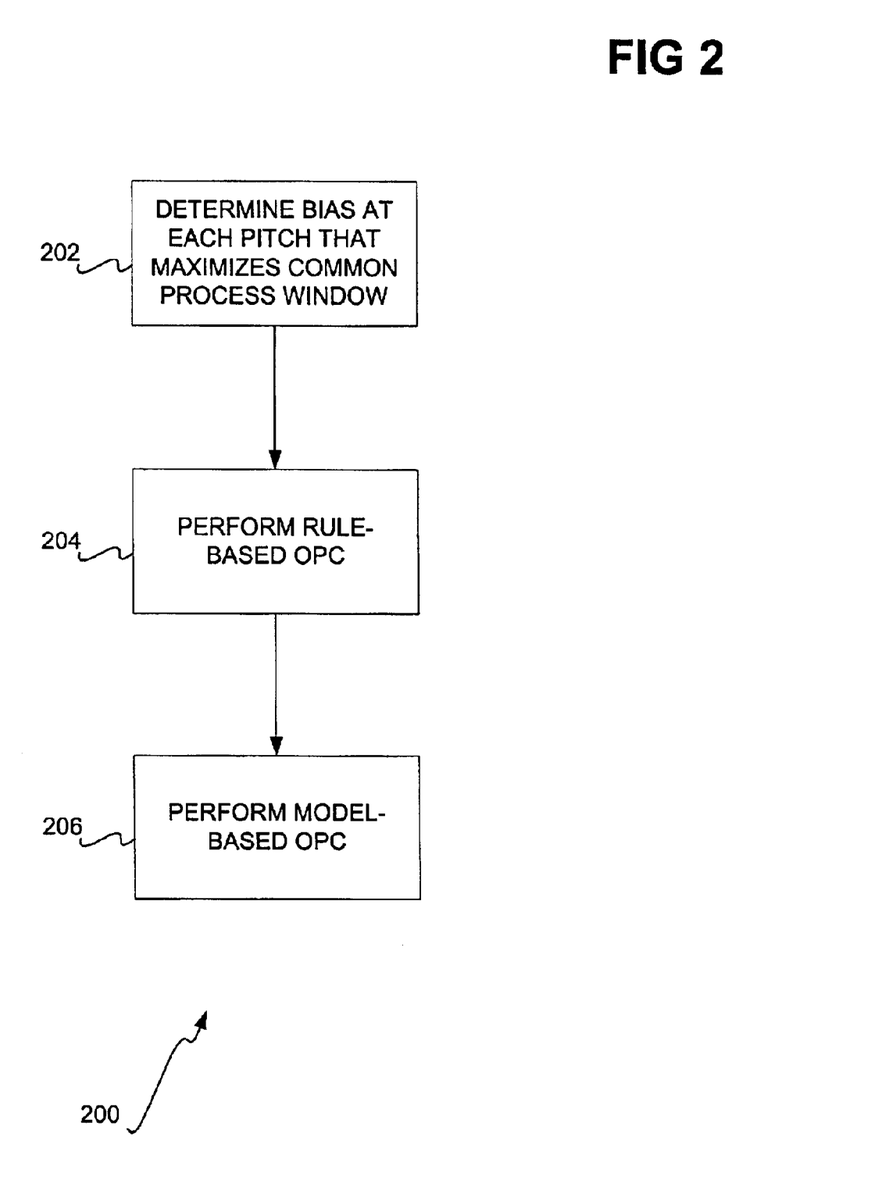
FIG. 2 is a flowchart of a method to create a photomask, according to an embodiment of the invention, such that a maximized common process window for a semiconductor design having features of varying pitch is achieved.

FIG. 2 shows the general approach 200 followed by at least some embodiments of the invention to achieve a maximized common process window for a semiconductor design having features of varying pitch. First, the bias needed at each pitch that maximizes the common process window for all the pitches, given a critical dimension (CD) specification for the design of the mask is determined (202). Generally, but not necessarily, the CD for the smallest pitch remains the same. The bias for patterns of other pitches is such that the process window center of the patterns of this pitch coincides with that of the patterns of the smallest pitch. This bias needed at each pitch can be determined by either simulation or experiment. Furthermore, determining the biases may involve retargeting the CD's of the original layout.

Next, rule-based optical proximity correction (OPC) is used, such as by using commercially available design-rule check (DRC) tools, to modify the original layout (204). Rule-based OPC is driven by user-defined rules. An example of a rule is, for one-dimensional line or space patterns, a given degree of bias is added to each pitch. For instance, the bias determined in 202 can be added. Finally, the layout is further modified by performing model-based OPC (206), with the resultant layout after rule-based OPC being the target, to assure that the after-development inspection (ADI) CD will be as close as possible to the modified layout CD after performing rule-based OPC. Model-based OPC is accomplished according to the simulation results of an empirical model. This is characterized by empirical semiconductor wafer data of sets of carefully and a priori designed test patterns. Desirably, the exposed semiconductor wafer CD's at each pitch are at least substantially equal to the CD specification for the pitch after performing the method 200 of FIG. 2.

Types of rule- and/or model-based OPC that can generally be performed include, but are not limited to, adding line-end shortening (LES) OPC patterns to the design, adding corner rounding OPC patterns to the design, and adding scattering bars (SB's) and/or anti-scattering bars (ASB's) to the design. SB's and ASB's are assist features used to enhance the printability of more isolated patterns, when off-axis illumination (OAI) is employed for the benefit of dense patterns. Assist features for one-dimensional line and space patterns are also referred to as SB's and ASB's, where they are typically added parallel to and a distance from the one-dimensional line and space patterns. The LES OPC patterns may include serifs and hammerheads. The corner rounding OPC patterns may include positive and negative serifs.

Figure 3A:
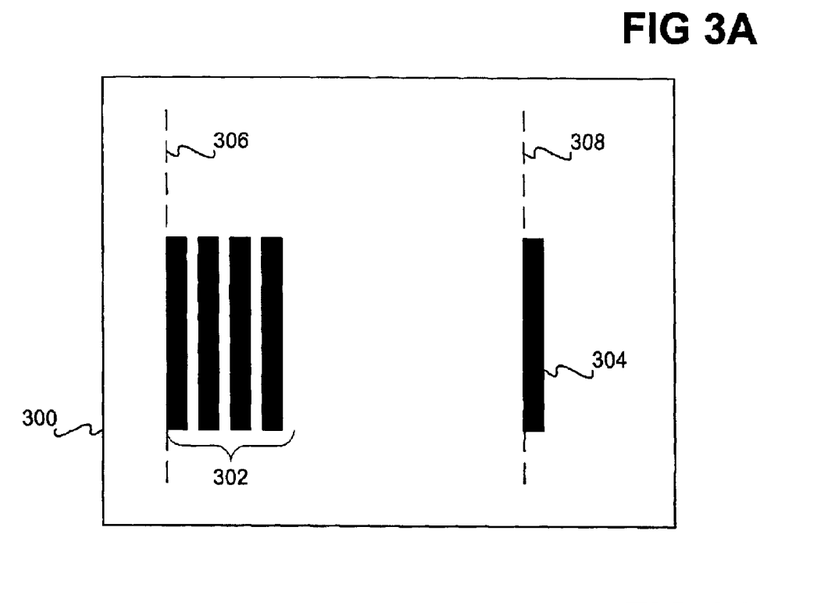
FIGS. 3A and 3B are diagrams showing an example of the addition of the determined bias to the pitches of a semiconductor design and the addition of OPC patterns to the design in accordance with an embodiment of the invention.
Figure 3B:
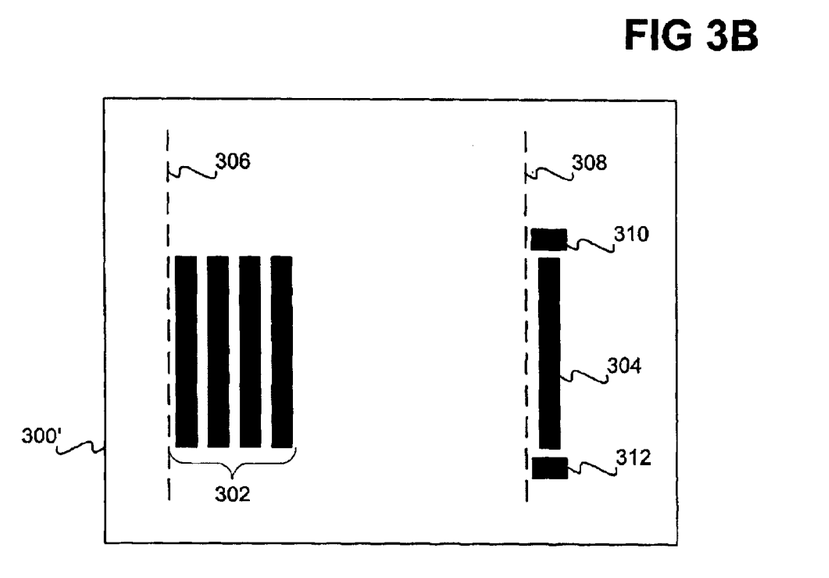

FIGS. 3A and 3B show an example of the addition of the determined bias and the addition of OPC patterns. In FIG. 3A, the photomask 300 has a semiconductor design including two features, a number of dense lines 302 having a small pitch, and an isolated line 304 having a large pitch. The dense lines 302 are aligned horizontally against the dotted line 306, whereas the isolated line 304 is aligned horizontally against the dotted line 308. After the bias for each pitch has been determined and added to the mask 300, and after (both rule- and model-based) OPC has been performed to the mask 300, the result is the photomask 300' of FIG. 3B. In FIG. 3B, the dense lines 302 have had a positive bias added in the horizontal direction, such that they are horizontally positioned to the right of the dotted line 306. Similarly, the isolated line 304 has had a positive bias added in the horizontal direction, such that it is horizontally positioned to the right of the dotted line 308. SB's 310 and 312 have also been added above and below, respectively, the isolated line 304.

Figure 4:
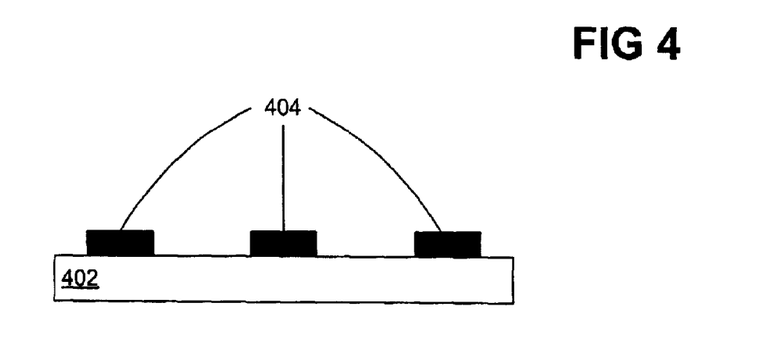
FIG. 4 is a diagram showing the side profile of an example mask that can be created or produced in conjunction with the invention.

The side profile of an example mask that can be created or produced in conjunction with the invention is shown in FIG. 4, and includes a glass surface 402 on which chrome 404 is added. The chrome 404 corresponds to the pattern, such as an OPC pattern, to be imprinted on the semiconductor wafer. Areas of the mask that do not have chrome added to the glass surface are referred to as clear regions, whereas areas that do have chrome added to the glass surface are referred to as opaque regions.

Figure 5:
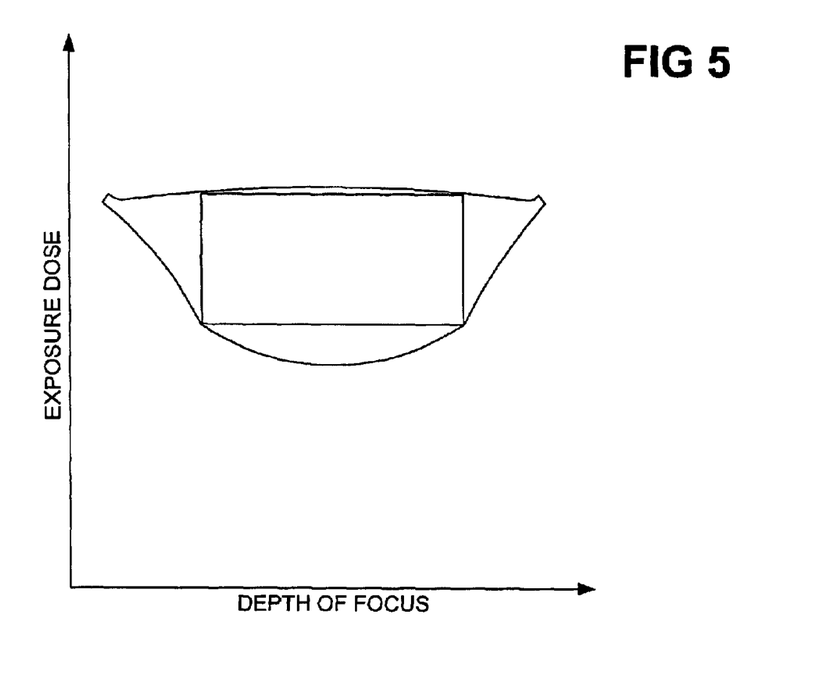
FIGS. 5, 6, 7, 8, and 9 are diagrams of ED process windows used to describe an example for maximizing the common process window for a semiconductor design, and that shows the advantageousness of the invention as compared to the prior art.
Figure 6:
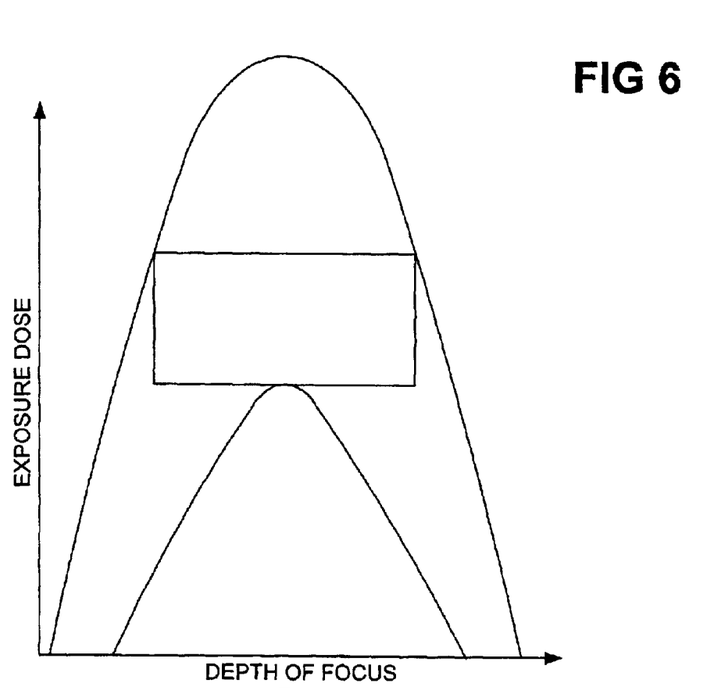
Figure 7:
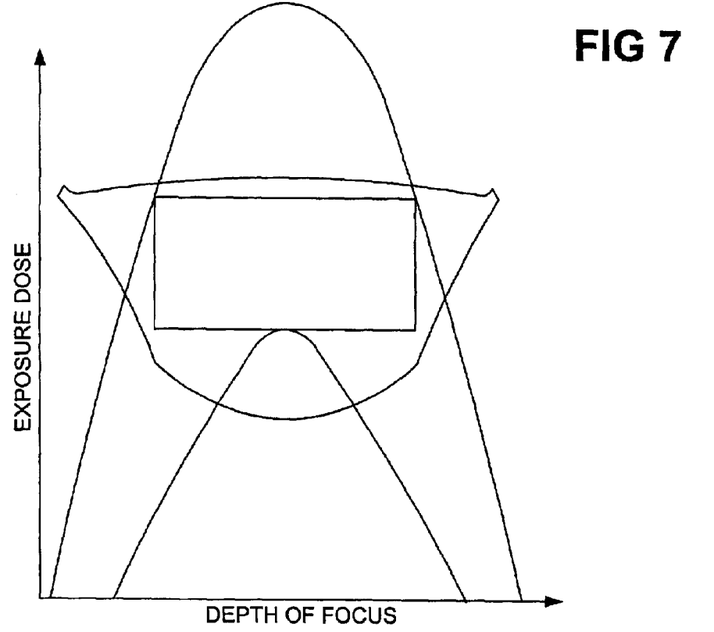

An example is now described that illustrates in particular the advantageousness of the invention as compared to the prior art. The common process window for a 130-nanometer (nm) trench through all pitches is to be maximized. However, for sake of illustrative clarity, only 240-nm and 1000-nm pitches are considered. For a trench of 1000-nm pitch, 100-nm ASB's at a distance (center-to-center) of 270 nm are added. The CD specification is +/−10%, such that the allowable CD is between 117 nm and 143 nm. If the CD on mask is 130 nm, then the process window for the trench of the 240-nm pitch is shown in FIG. 5. The intensity threshold, related to exposure, at the process window center is 0.36. To align the process window of a more-isolated trench, such as the trench having a 1000-nm pitch, the CD should be biased from 130 nm to 144 nm. In this case, the process window for such a 1000-nm pitch trench is shown in FIG. 6. The intensity threshold at the process window center is also 0.36, and the common process window of the two pitches is maximized, as is shown in FIG. 7.

Figure 8:
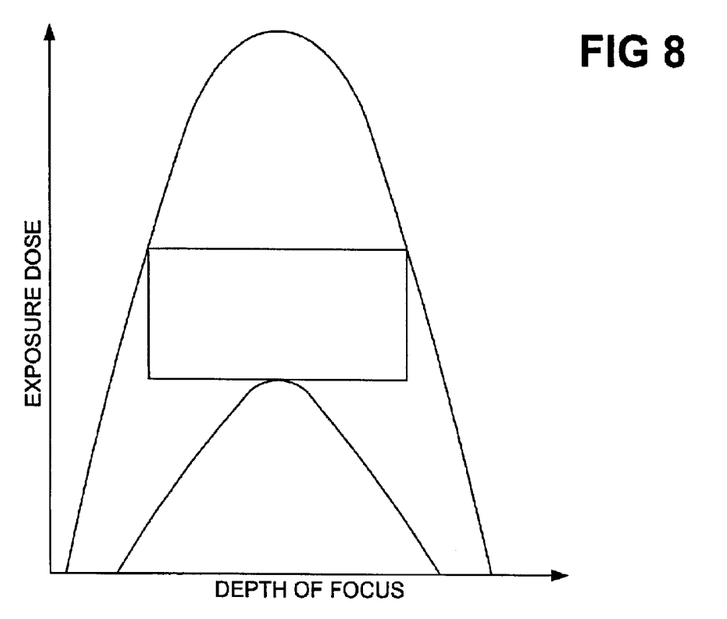
Figure 9:
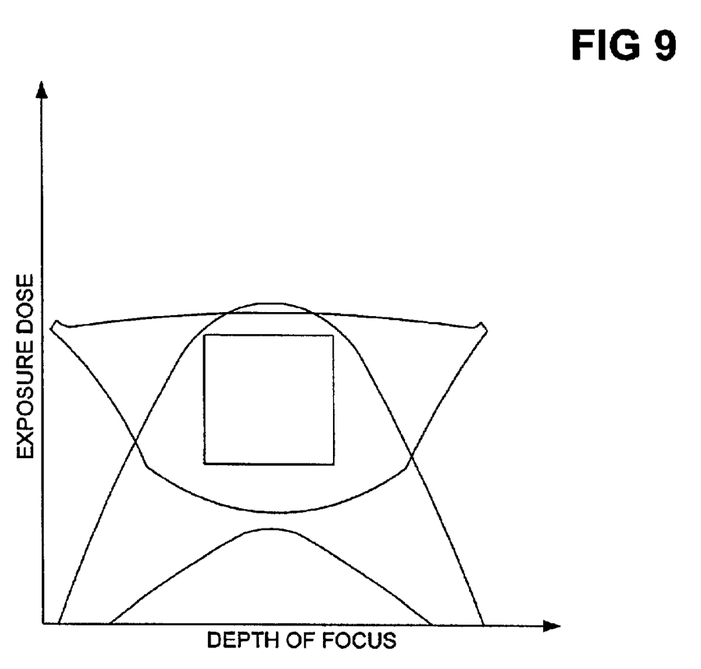

If aligning process windows is not considered, then aligning CD's of the individual pitches is instead desired. For a 240-nm pitch, if an ADI CD of 130 nm is desired by exposing a 130-nm mask CD, then an exposure corresponding to the intensity threshold of 0.35 should be used. To have the same ADI CD for a trench of 1000-nm pitch at 0.35 intensity threshold, the mask CD should be biased from 130 nm to 136 nm, rather than 144 nm. In this case, the process windows is shown in FIG. 8. Despite that the ADI CD of the trench of 240-nm pitch and the trench of 1000-nm pitch are both aligned to 130 nm, process windows of the trench of the two pitches are shifted from each other, which makes their common process window smaller, as shown in FIG. 9. FIG. 9 is thus the result of applying only model-based OPC, which uses the original layout as the OPC target. Therefore, to have the ADI CD different from the original layout, the original layout is first modified by rule-based OPC, and then model-based OPC with the modified layout as the OPC target, as has been described. Therefore, performing rule-based OPC followed by model-based OPC, as has been described as the method 200 of FIG. 2, is more desirable than performing only rule-based OPC.

Figure 10:
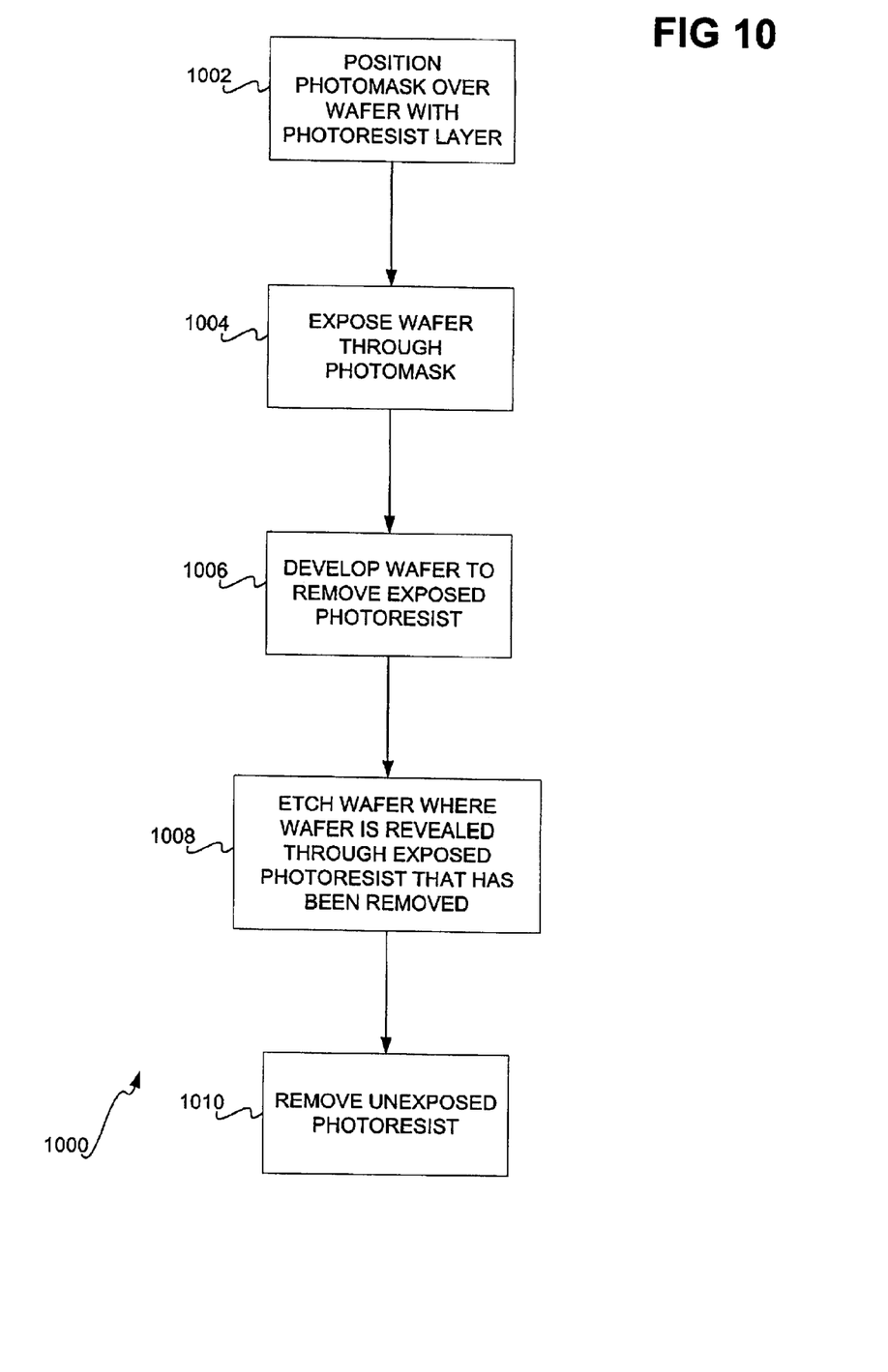
FIG. 10 is a flowchart of a typical method to create one or more semiconductor devices on a wafer using a photolithographic process, and preferably employing a photomask according to an embodiment of the invention.

Finally, FIG. 10 outlines a typical method 1000 for fabricating semiconductor devices on a semiconductor wafer, and in conjunction with which a photomask according to the invention may be utilized. Other steps and acts may be performed in addition to or in lieu of those shown in FIG. 10, as can be appreciated by those of ordinary skill within the art. The mask is first positioned over the wafer, where the wafer has a top layer of photoresist (1002). The wafer is exposed through the mask (1004), such that the photoresist has unexposed and exposed regions. The exposed regions correspond to the photoresist that is beneath clear regions of the mask, and the unexposed regions correspond to the photoresist that is beneath opaque regions. The wafer is developed to remove the exposed photoresist (1006), and then etched where the wafer has been revealed through the exposed photoresist that has been removed (1008). The unexposed photoresist is then also removed (1010).

It is noted that, although specific embodiments have been illustrated and described herein, it will be appreciated by those of ordinary skill in the art that any arrangement is calculated to achieve the same purpose may be substituted for the specific embodiments shown. This application is intended to cover any adaptations or variations of the present invention. Therefore, it is manifestly intended that this invention be limited only by the claims and equivalents thereof.

What is claimed is:

1. A method for producing a photomask for semiconductor photolithography processing comprising:

for each pitch of a plurality of pitches within a semiconductor design, determining a bias needed at the pitch that maximizes a common process window for the plurality of pitches given a critical dimension (CD) specification for a semiconductor design of the photomask;

modifying an original layout for the semiconductor design of the photomask by performing rule-based optical-proximity correction (OPC), including adding the bias determined at each pitch, to yield a modified layout for the semiconductor design of the photomask; and, further modifying the modified layout for the semiconductor design of the photomask by performing model-based OPC on the modified layout such that exposed semiconductor wafer CD's at each pitch are at least substantially equal to the CD specification for the pitch, to yield a final layout for the semiconductor design of the photomask.

2. The method of claim 1, wherein determining the bias needed comprises determining the bias needed by simulation.

3. The method of claim 1, wherein determining the bias needed comprises determining the bias needed by experiment.

4. The method of claim 1, wherein modifying the original layout for the semiconductor design of the photomask by adding the bias determined at each pitch comprises retargeting the CD's of the original layout.

5. The method of claim 1, wherein the common process window has a first axis measuring depth of focus (DOF) and a second axis measuring light-exposure dose.

6. The method of claim 5, wherein the first axis is an x-axis and the second axis is a y-axis.

7. A photomask for semiconductor photolithography processing comprising:

a semiconductor design having a critical dimension (CD) specification and having had applied thereto rule-based and model-based optical proximity correction (OPC), the rule-based OPC including application of biases determined at each of a plurality of pitches of the semiconductor design;

a plurality of pitches within the semiconductor design; and, a maximized common process window for the plurality of pitches given the CD specification.

8. The photomask of claim 7, wherein the common process window has a first axis measuring depth of focus (DOF) and a second axis measuring light-exposure dose.

9. The photomask of claim 8, wherein the first axis is an x-axis and the second axis is a y-axis.

10. The photomask of claim 7, wherein the maximized common process window is determined by determining a bias needed at each pitch that maximizes the common process window, and adding the bias determined at each pitch.

11. The photomask of claim 10, wherein the maximized common process window is further determined by performing rule-based and model-based OPC such that exposed semiconductor wafer CD's at each pitch are at least substantially equal to the CD specification for the pitch.

12. The photomask of claim 10, wherein determining the bias needed at each pitch comprises determining the bias needed at each pitch by simulation.

13. The photomask of claim 10, wherein determining the bias needed at each pitch comprises determining the bias needed at each pitch by experiment.

14. A semiconductor device formed at least in part by a method comprising:

positioning a photomask over a semiconductor wafer having a top layer of photoresist, the photomask having a maximized common process window for a plurality of pitches of a semiconductor design to which rule-based and model-based optical proximity correction (OPC) has been applied, given a critical dimension (CD) specification of the semiconductor design, the rule-based OPC including application of biases determined at each of a plurality of pitches of the semiconductor design;

exposing the semiconductor wafer through the photomask positioned thereover, such that the top layer of photoresist includes exposed parts under clear parts of the photomask and unexposed parts under opaque parts of the photomask;

developing the semiconductor wafer to remove the exposed parts of the top layer of photoresist;

etching the semiconductor wafer where the wafer is revealed through the exposed parts of the top layer of photoresist that has been removed; and, removing the unexposed parts of the top layer of photoresist.

15. The semiconductor device of claim 14, wherein the common process window has a first axis measuring depth of focus (DOE) and a second axis measuring light-exposure dose.

16. The semiconductor device of claim 15, wherein the first axis is an x-axis and the second axis is a y-axis.

17. The semiconductor device of claim 14, wherein the maximized common process window is determined by determining a bias needed at each pitch that maximizes the common process window, and adding the bias determined at each pitch.

18. The semiconductor device of claim 17, wherein the maximized common process window is further determined by performing rule-based and model-based OPC such that exposed semiconductor wafer CD's at each pitch are at least substantially equal to the CD specification for the pitch.

19. The semiconductor device of claim 17, wherein determining the bias needed at each comprises determining the bias needed at each pitch by simulation.

20. The semiconductor device of claim 17, wherein determining the bias needed at each comprises determining the bias needed at each pitch by experiment.

* * * * *